United States Patent
Dennard et al.

(10) Patent No.: US 7,704,854 B2
(45) Date of Patent: Apr. 27, 2010

(54) METHOD FOR FABRICATING SEMICONDUCTOR DEVICE HAVING CONDUCTIVE LINER FOR RAD HARD TOTAL DOSE IMMUNITY

(75) Inventors: Robert H. Dennard, Croton-on-Hudson, NY (US); Mark C. Hakey, Fairfax, VT (US); David V. Horak, Essex Junction, VT (US); Sanjay Mehta, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/115,690

(22) Filed: May 6, 2008

(65) Prior Publication Data
US 2009/0280619 A1    Nov. 12, 2009

(51) Int. Cl.
*H01L 21/76* (2006.01)
(52) U.S. Cl. .............................. 438/430; 257/E21.564; 257/E21.54; 257/E21.545; 257/E21.546; 257/E21.561
(58) Field of Classification Search .......... 257/E21.564, 257/E21.561, E21.54, E21.545; 438/430
See application file for complete search history.

(56) References Cited

U.S. PATENT DOCUMENTS

| | | | |
|---|---|---|---|
| 4,825,278 A | 4/1989 | Hillenius et al. | |
| 4,903,108 A | 2/1990 | Young et al. | |
| 5,422,294 A | 6/1995 | Noble, Jr. | |
| 5,770,484 A | 6/1998 | Kleinhenz | |
| 6,274,919 B1 | 8/2001 | Wada | |
| 6,420,749 B1 | 7/2002 | Divakaruni et al. | |
| 6,555,891 B1* | 4/2003 | Furukawa et al. ........... | 257/505 |
| 6,627,484 B1* | 9/2003 | Ang ........................... | 438/154 |
| 7,018,907 B2* | 3/2006 | Lee ........................... | 438/430 |

* cited by examiner

*Primary Examiner*—Ha Tran T Nguyen
*Assistant Examiner*—Aaron A Dehne
(74) *Attorney, Agent, or Firm*—Anthony J. Canale; Greenblum & Bernstein P.L.C.

(57) ABSTRACT

The invention relates to a method includes etching at least one shallow trench in at least an SIO layer; forming a dielectric liner at an interface of the SIO layer and the SIO layer; forming a metal or metal alloy layer in the shallow trench on the dielectric liner; and filling the shallow trench with oxide material over the metal or metal alloy.

5 Claims, 2 Drawing Sheets

METHOD FOR FABRICATING SEMICONDUCTOR DEVICE HAVING CONDUCTIVE LINER FOR RAD HARD TOTAL DOSE IMMUNITY

CROSS-REFERENCE TO RELATED APPLICATIONS

This application is related to U.S. Ser. No. 12/115,699 filed on the same day and currently pending.

FIELD OF THE INVENTION

The present invention generally relates to a method for fabricating a semiconductor device having conductive liner for rad hard total dose immunity.

BACKGROUND

Ionizing radiation can cause single event upsets (SEUs) as well as total failure resulting from total dose (long accumulation of radiation) in semiconductor ICs. Ionizing radiation can directly upset storage circuits, such as SRAMs, register files and flip-flops. Moreover, radiation events in combinational logic create voltage glitches that can be latched. SEUs may cause the IC to perform incorrect or illegal operations; whereas, an accumulation of radiation over a long period of time may additionally lead to complete device failure.

By way of a more specific example, due to prolonged radiation exposure (total dose) a charge can build up at an interface between an oxide (STI) and an SOI. This build up will eventually change the charge flow at the SOI interface. This leads to shift in VT of the device. If the Vt is allowed to move further enough from the design point, the circuitry can fail to operate.

Methods to prevent SEUs and total dose include adding spatial and/or temporal redundancy, so that a single radiation event cannot cause an SEU. Redundancy solutions incur area, power and performance penalties. Consequently, there is a need to improve detection schemes of radiation events in ICs.

Accordingly, there exists a need in the art to overcome the deficiencies and limitations described hereinabove.

SUMMARY

In a first aspect of the invention, a method comprises: etching at least one shallow trench in at least an Si layer; forming a dielectric liner at an interface of the Si layer and the Si layer; forming a metal or metal alloy layer in the shallow trench on the dielectric liner; and filling the shallow trench with oxide material over the metal or metal alloy.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a method of forming a conductive liner for rad hard total dose immunity and a structure thereof. More specifically, the present invention teaches the use of a liner at an interface between an STI structure and SOI. This liner is formed in the STI structure prior to oxide fill. The liner will prevent a charge build up at the interface between an oxide (STI) and the SOI due to prolonged radiation exposure (total dose) thus preventing a change in the charge flow at the SOI interface.

Method of Forming Structures in Accordance with the Invention

Figure 1:
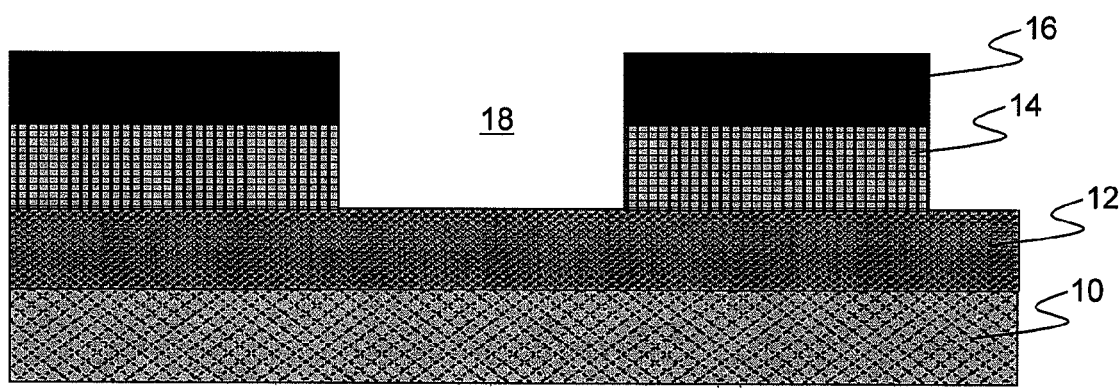
FIGS. 1 and 2 show beginning and intermediate structures and respective processing steps in accordance with the invention.

FIG. 1 shows a beginning structure and respective processing steps in accordance with a first aspect of the invention. Specifically, FIG. 1 shows a BOX 12 formed on a wafer 10 such as, for example, a silicon wafer. An SOI 14 is bonded to the BOX 12 in a conventional manner. The structure also can be formed by oxygen implant and anneal. As the structure thus far described is a conventional and commercially available structure, no further explanation is required herein.

Still referring to FIG. 1, a pad nitride (oxide) layer 16 is deposited on the SOI 14. In conventional lithographic and etching processes, shallow trenches 18 are formed in the structure and more specifically in the pad nitride layer 16 and the SOI 14. For example, a photolithographic masking layer (not shown) can be exposed to light to form openings, with a subsequent etching process (e.g., reactive ion etching (RIE)) to form the shallow trenches 18. A wet or dry resist/arc strip is used to remove the remains of the masking material. The shallow trenches 18 will be used to form shallow trench isolation (STI) structures.

Figure 2:
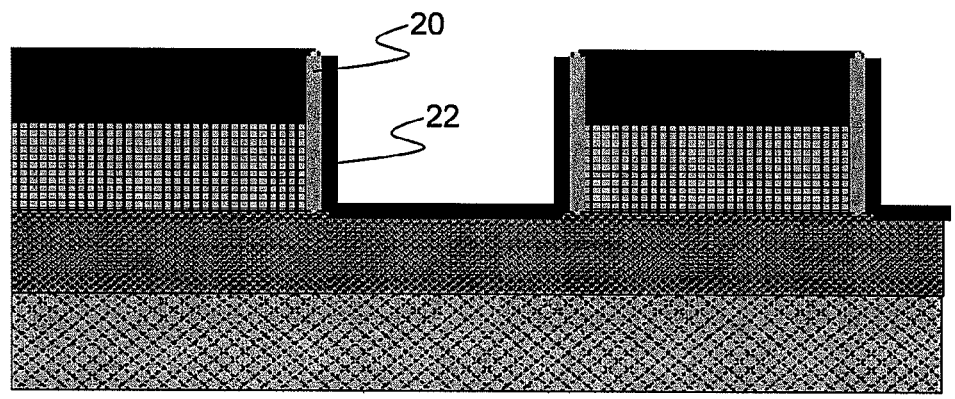

FIG. 2 shows an intermediate structure and processing steps in accordance with the invention. As shown in FIG. 2, an STI dielectric liner 20 is formed on the sidewalls of the trenches 18. The STI dielectric liner 20 may be formed along the SOI sidewall by a conventional oxidation, nitridation or a combination of both. An alternate method is to deposit a dielectric layer, possibly in conjunction with sidewall oxidation, and anisotropically etched to remove any dielectric formed on BOX (12) or on pad nitride (16) thereby forming dielectric liner 20. In embodiments, the STI dielectric liner 20 is about 10 Å to 50 Å.

In embodiments, the STI dielectric liner 20 may also be formed on the exposed BOX 12, forming a Faraday cage. In this embodiment, the STI dielectric liner 20 is deposited within the shallow trench 18 in a conventional manner. In either scenario, the STI dielectric liner 20 is designed to Still referring to FIG. 2, a conductive liner 22 is formed over the STI dielectric liner 20. In embodiments the conductive liner is formed on the BOX 12, when the STI dielectric liner 20 is not formed thereon. The conductive liner 22 can be a metal or a metal alloy such as, for example, Ta, Ti, Ru, TaRu, TiN, TaN Al, W. The conductive liner is designed to prevent building up of radiation induced charge in the STI dielectric. The conductive liner 22 may be about 20 Å to 80 Å. The pad nitride layer 16 may also be polished to remove any residue.

Figure 3:
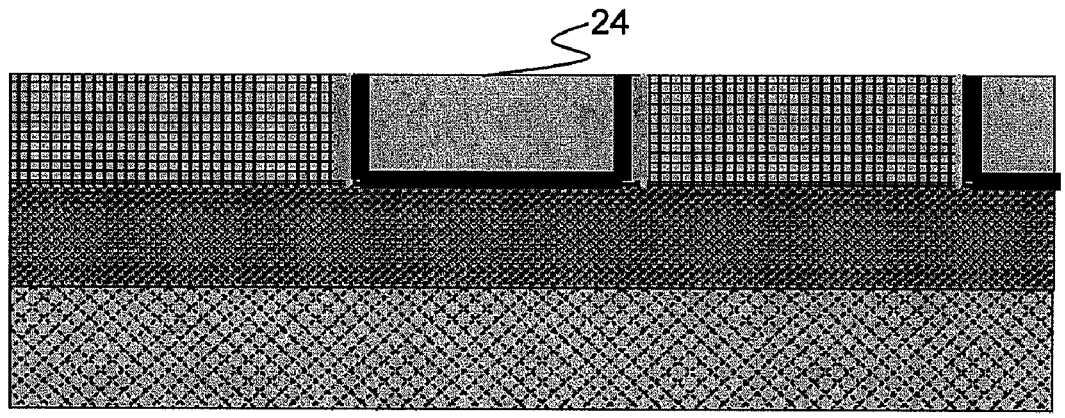
FIGS. 3 and 4 show alternate final structures and respective processing steps in accordance with the invention.
Figure 4:
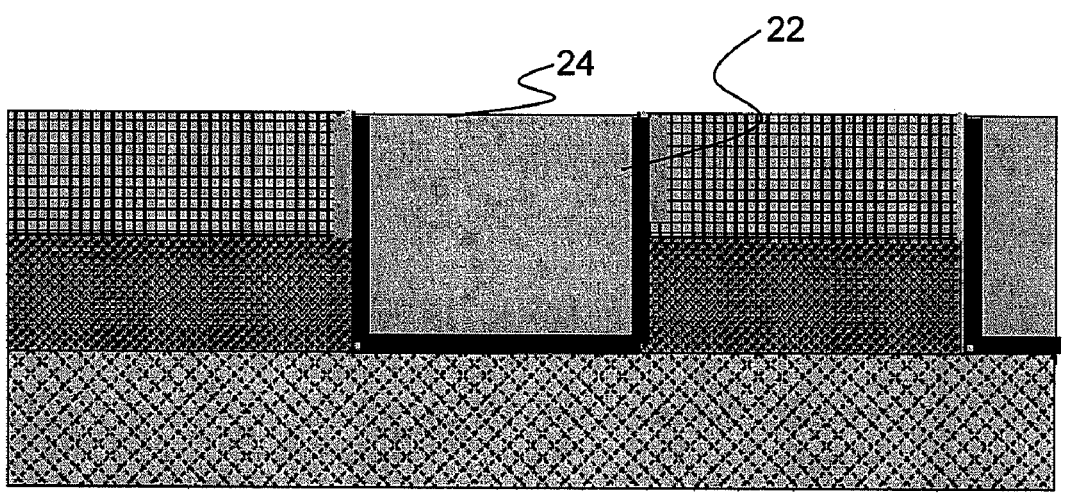

FIGS. 3 and 4 show alternate final structures and respective processing steps. Specifically, in FIG. 3, an STI fill step is performed to deposit oxide within the shallow trench thereby forming an STI structure 24. The pad nitride layer 16 may be stripped. Ideally, the STI structure 24 is flush with the SOI 14 prior to performing gate structures; although, it is understood that the STI structure 24 may be above or below the SOI 14 due to processing tolerances. The conductive liner must be electrically separated from the Gate electrode.

FIG. 4 shows the STI structure 24 extending through the BOX 12 to the wafer 10. In this embodiment, the etching step described in FIG. 2 would extend through the BOX 12. As should be understood, as a result of the oxidation process, the STI dielectric liner 20 would not be formed on the sidewalls of the BOX 12 and if any are formed on the bottom of the STI opening, need to be removed allowing the conductive liner to have an electrical contact to the substrate. The conductive liner 22, though, is formed on the BOX 12 and the exposed area of the wafer 10.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

While the invention has been described in terms of embodiments, those of skill in the art will recognize that the invention can be practiced with modifications and in the spirit and scope of the appended claims.

What is claimed is:

1. A method comprising:
    etching an at least one shallow trench in an Si layer and into a BOX layer formed under the Si layer;
    forming a dielectric liner at sidewalls of the at least one shallow trench on the Si layer;
    forming a metal or metal alloy layer in the at least one shallow trench on the dielectric liner;
    filling the at least one shallow trench with oxide material over the metal or metal alloy layer; and
    wherein the metal or metal alloy layer is formed directly on the BOX layer and an exposed portion of an underlying wafer.

2. The method of claim 1, wherein the dielectric liner is deposited onto the underlying BOX layer.

3. The method of claim 1, wherein the metal or metal alloy layer is formed directly on the underlying BOX layer within the at least one shallow trench.

4. A method, comprising:
    etching at least one shallow trench in an upper SOI layer and underlying BOX layer;
    forming a dielectric liner only on sidewalls of the upper SOI layer within the trench;
    forming a metal or metal alloy layer in the shallow trench on the dielectric liner and directly on sidewalls of the underlying BOX layer within the trench; and
    filling the shallow trench with oxide material over the metal or metal alloy layer.

5. The method of claim 4, further comprising removing any excess material that is used to form the dielectric liner from the sidewalls and bottom surface of the underlying BOX layer within the trench, prior to the filling step.

* * * * *